United States Patent
Minarovic (10) Patent No.: US 11,263,538 B1
(45) Date of Patent: Mar. 1, 2022

(54) PREDICTING PATHS OF UNDERGROUND UTILITIES

(71) Applicant: Joe T. Minarovic, Georgetown, TX (US)

(72) Inventor: Joe T. Minarovic, Georgetown, TX (US)

( * ) Notice: Subject to any disclaimer, the term of this patent is extended or adjusted under 35 U.S.C. 154(b) by 804 days.

(21) Appl. No.: 16/115,190

(22) Filed: Aug. 28, 2018

(51) Int. Cl.
*G06N 5/04* (2006.01)
*G06N 20/00* (2019.01)

(52) U.S. Cl.
CPC ............. *G06N 5/043* (2013.01); *G06N 20/00* (2019.01)

(58) Field of Classification Search
CPC ............................... G06N 5/043; G06N 20/00
See application file for complete search history.

(56) References Cited

U.S. PATENT DOCUMENTS

| | | | |
|---|---|---|---|
| 7,382,266 B2 | 6/2008 | Minarovic | |
| 2018/0121576 A1* | 5/2018 | Mosher | G06F 30/20 |

OTHER PUBLICATIONS

Chen, Huanhuan, and Anthony G. Cohn. "Buried utility pipeline mapping based on multiple spatial data sources: A Bayesian data fusion approach." Twenty-Second International Joint Conference on Artificial Intelligence. 2011. (Year: 2011).*
Mark, David, "Spatial Representation: A Cognitive View", Geographical Information Systems: Principles and Applications, second edition, v. 1, ch. 7, pp. 81-89 (1999).

* cited by examiner

*Primary Examiner* — Eric Nilsson
(74) *Attorney, Agent, or Firm* — Jack V. Musgrove (57) ABSTRACT

The most likely path for an underground utility having an unknown location is predicted using artificial intelligence. A cognitive system is trained with details associated with historical utility installations whose underground paths are known. The system is applied to whatever installation details are available for the unknown underground utility such as geographic features which are subjected to spatial correlation to derive geographic locations relative to a region of interest for the underground utility. Cognitive analysis is performed on the locations in association with the features to generate candidate paths for the utility. The candidate paths are presented to the user along with computed confidence scores. The installation details may further include nongeographic features used in the cognitive analysis such as a date of installation of the utility or an entity associated with the utility.

18 Claims, 6 Drawing Sheets

PREDICTING PATHS OF UNDERGROUND UTILITIES

BACKGROUND OF THE INVENTION

Field of the Invention

The present invention generally relates to locating obscured objects, and more particularly to a method of predicting the location of buried utilities such as water or gas lines.

Description of the Related Art

Buried conduits are employed for supplying a wide variety of utilities, including pipelines for gas, water and sewage, and cables for telephone, optical fiber, power and television. It is often necessary to locate such facilities to repair, modify, or replace sections of the conduits. Conversely, it is important to know with as much accuracy as possible the approximate vicinity of such buried objects in order to avoid disturbing them when digging or excavating for other purposes. Above-ground marking devices may be installed immediately after a utility is buried, but it is also common to use underground marking devices or systems to enable the later location of a utility access hatch.

In the past, different approaches have been used to indicate the presence of buried utilities, namely, warning tape, painted symbols or surface markings, and electronic marker systems. A warning tape is simply a band of plastic which is placed above the pipeline before burial. These tapes are used to alert the excavation team of the presence of the pipeline before any damage thereto might occur. As the backhoe or other mechanical digger excavates the site, it will hopefully uproot a portion of the warning tape prior to contact with the pipeline. Painting symbols on the ground is another common method of indicating the location of buried utility components. A worker can simply paint markings at the area above or near the buried component, and at a later time (using visual identification) pinpoint the location previously marked. Other types of visual surface markings can be used in place of painted markings, such as adhesive markers attached to the surface, or small metallic markers embedded into the ground so as to be level with the surface. Electronic marker systems for locating buried objects generally consist of two types, active and passive markers (or transponders). Active markers require the use of a power supply which amplifies a signal source (usually an AC signal). The signal is radiated by the underground marker and detected by a receiver unit above ground. Passive markers have no power supply, but rather operate in a resonant mode, responsive to a transmitted electromagnetic field, and are usually limited to detection of a single frequency signal.

Electronic markers, as well as warning tapes, are usually color-coded according to the particular type of utility line they mark. Specifically, gas line markers are yellow; telephone cable markers are orange; waste water tunnel markers are green; water pipe markers are blue; and power supply markers are red. Similarly, the passive marker is "coded" by tuning the coil for a specific resonant frequency. Five distinct frequencies have been designated: 83.0 kHz for gas; 101.4 kHz for telephone; 121.6 kHz for sewage; 145.7 kHz for water; and 169.8 kHz for power. In this manner, a locating technician searching for, say, a gas line, cannot accidentally activate a telephone marker since his transmitter will only be sending out an 83 kHz signal, which is not within the bandwidth for a telephone marker tuned for 101.4 kHz. These frequencies have been designated by convention, and are not otherwise restrictive.

SUMMARY OF THE INVENTION

The present invention in at least one embodiment is generally directed to a method of predicting a path of an underground utility having an unknown location by receiving installation details associated with the underground utility including geographic features from a user, applying spatial correlation to the geographic features to derive geographic locations relative to a region of interest for the underground utility, performing cognitive analysis on the geographic features in association with the geographic locations using a cognitive system to generate at least one candidate utility path, and presenting the candidate utility path to the user. The cognitive system can be trained with historical details associated with multiple historical utility installations whose underground paths are known. In the illustrative implementation, the region of interest has a rectangular boundary, the installation details further include nongeographic features, and the cognitive analysis uses the nongeographic features. The nongeographic features can include for example a date of installation of the underground utility, or an entity associated with the utility, such as the installer, operator or owner. In a preferred implementation the cognitive analysis generates multiple candidate utility paths each of which is presented to the user, along with computed confidence scores. A user of the system can follow up the path prediction by taking action such as confirming that the underground utility lies along the selected candidate utility path.

The above as well as additional objectives, features, and advantages in the various embodiments of the present invention will become apparent in the following detailed written description.

BRIEF DESCRIPTION OF THE DRAWINGS

The present invention may be better understood, and its numerous objects, features, and advantages of its various embodiments made apparent to those skilled in the art by referencing the accompanying drawings.

The use of the same reference symbols in different drawings indicates similar or identical items.

DESCRIPTION OF THE PREFERRED EMBODIMENT(S)

It is often desirous to determine the location of an underground facility such as a pipeline or cable (hereinafter collectively referred to as a conduit) in order to perform maintenance on the conduit or to simply know where the conduit is so that it is not damaged by nearby excavation work. In cases where the conduit has been previously marked using the techniques described in the Background section, this task is fairly straightforward. A craftsman can follow the above-ground path of the conduit by using an electronic locator or similar device to detect the presence of discrete markers or a tracer wire placed along the conduit when it was buried. However, there are many instances where conduits are not so marked. Also, due to various factors such as the weather (e.g., lightning or rain), rodents, insects, corrosion and inadvertent third-party actions, tracer wire on buried pipe is easily destroyed or rendered ineffective. According to some estimates, there are more than three million miles of underground natural gas pipes in America alone whose locations are unknown. There are other approaches to finding conduits of unknown location such as ground-penetrating radar, but without some clue as to where to begin the search such approaches can be prohibitively expensive.

It would, therefore, be desirable to devise an improved method of locating underground facilities which did not require extensive manual involvement. It would be further advantageous if the method could be applied to any type of utility in most any setting. These and other advantages are achieved by the present invention in its various implementations by using a cognitive system to predict the path of an underground utility. The cognitive system is trained using data from existing installations of different types of utilities for which the conduit paths are known. By providing a spatial correlation of various geographic features along with other data, ground truths for the cognitive system can be derived.

Cognitive systems are generally known in the art. A cognitive system (sometimes referred to as deep learning, deep thought, or deep question answering system) is a form of artificial intelligence that uses machine learning and problem solving. Cognitive systems often employ neural networks although alternative designs exist. The neural network may be of various types. A feedforward neural network is an artificial neural network wherein connections between the units do not form a cycle. The feedforward neural network was the first and simplest type of artificial neural network devised. In this network, the information moves in only one direction, forward, from the input nodes, through the hidden nodes (if any) and to the output nodes. There are no cycles or loops in the network. As such, it is different from recurrent neural networks. A recurrent neural network is a class of artificial neural network where connections between units form a directed cycle. This creates an internal state of the network which allows it to exhibit dynamic temporal behavior. Unlike feedforward neural networks, recurrent neural networks can use their internal memory to process arbitrary sequences of inputs. A convolution neural network is a specific type of feed-forward neural network based on animal visual perception, and so is particularly useful in processing image data. Convolutional neural networks are similar to ordinary neural networks but are made up of neurons that have learnable weights and biases.

Modern implementations of artificial intelligence apply a sundry of advanced cognitive techniques such as natural language processing, information retrieval, knowledge representation, automated reasoning, and machine learning to the field of open domain question answering. Such cognitive systems can rely on existing documents or data (corpora) and analyze them in various ways in order to extract answers relevant to a query, such as person, location, organization, and particular objects, or identify positive and negative sentiment. Different techniques can be used to analyze natural language, identify sources, find and generate hypotheses, find and score evidence, and merge and rank hypotheses. Models for scoring and ranking the answer can be trained on the basis of large sets of question (input) and answer (output) pairs. The more algorithms that find the same answer independently, the more likely that answer is correct, resulting in an overall score or confidence level.

Figure 1:
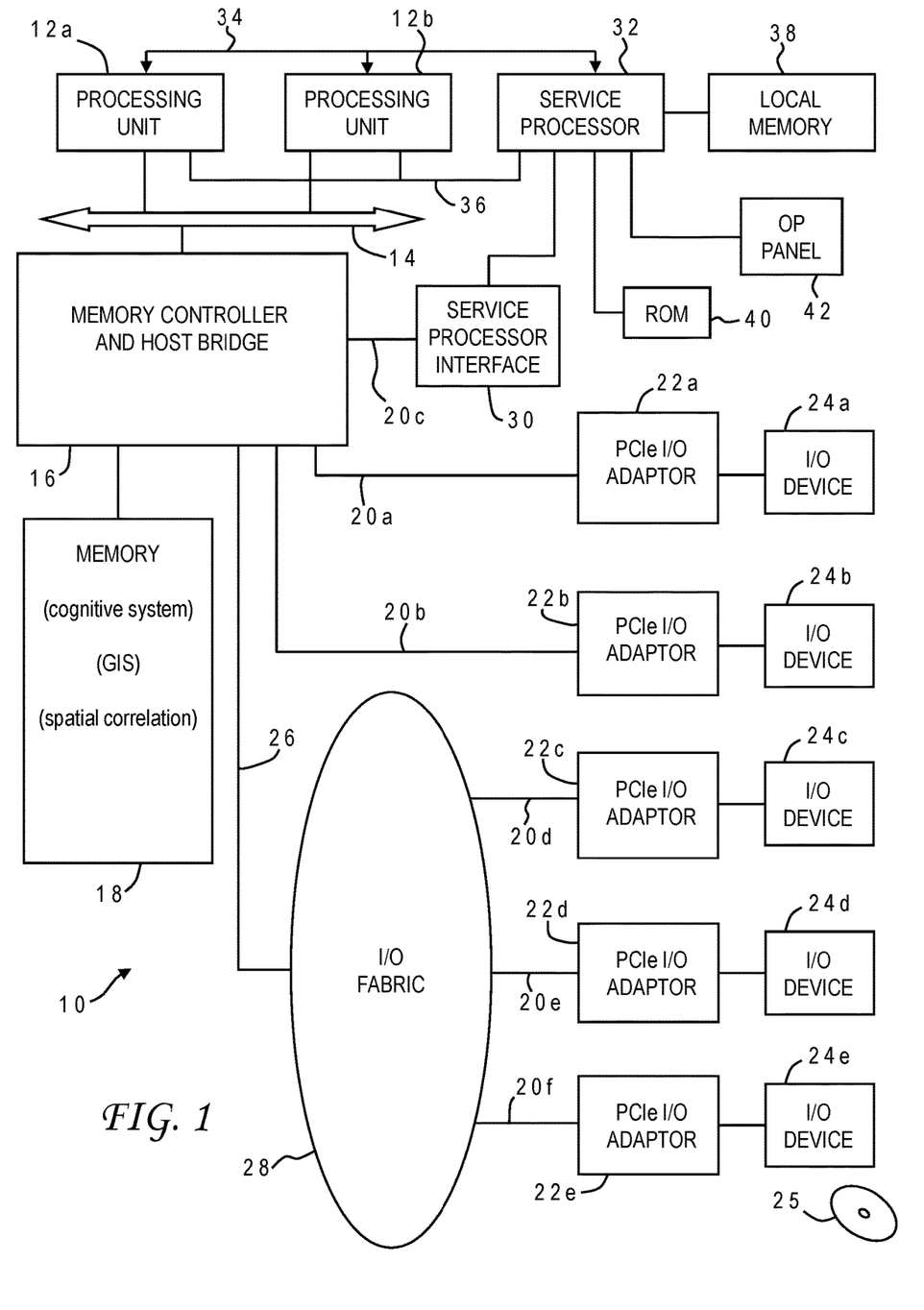
FIG. 1 is a block diagram of a computer system programmed to carry out the prediction of underground utilities using cognitive analysis in accordance with one implementation of the present invention.

With reference now to the figures, and in particular with reference to FIG. 1, there is depicted one embodiment 10 of a computer system in which the present invention may be implemented to carry out prediction of an underground utility path. Computer system 10 is a symmetric multiprocessor (SMP) system having a plurality of processors 12a, 12b connected to a system bus 14. System bus 14 is further connected to and communicates with a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches. System memory 18 has loaded therein a one or more applications in accordance with the present invention such as a cognitive system, a geographic information system (GIS), and a spatial correlation routine.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive which receives an optical disk 25 (one example of a computer readable storage medium) such as a CD or DVD, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the cognitive prediction system of the present invention, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Computer system 10 carries out program instructions for a cognitive process that uses novel training and correlation techniques to predict one or more likely paths of an underground utility. Accordingly, a program embodying the invention may additionally include conventional aspects of various cognitive tools, and these details will become apparent to those skilled in the art upon reference to this disclosure.

Figure 2:
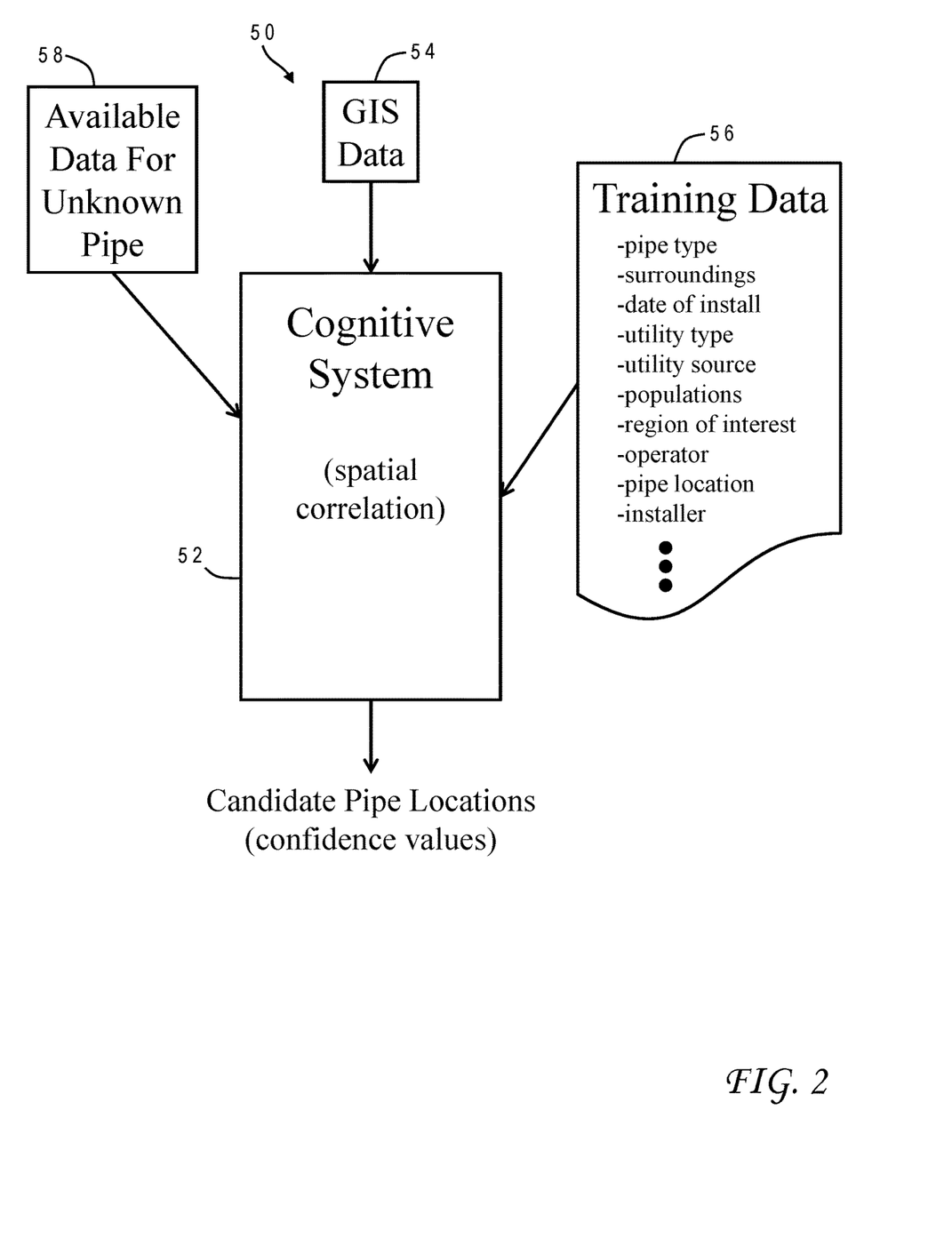
FIG. 2 is a high-level block diagram of a training environment for a cognitive system in accordance with one implementation of the present invention.

Referring now to FIG. 2, there is depicted a training and evaluation environment 50 for a cognitive system 52 in accordance with one implementation of the present invention. Environment 50 includes geographic information system data 54 and training data 56. A geographic information system (GIS) is a framework for gathering, managing, and analyzing data. Based in geographic terms, GIS can integrate many types of data. It analyzes spatial location and organizes layers of information into various visualizations using maps and 3D scenes. GIS data 54 may be provided from known databases, private contractors, or curated specifically for the present invention. Training data 56 relates to a plethora of data relating to utility installations whose locations (conduit paths) are known. In various implementations, training data 56 includes: the type of pipe or cable that was installed (size as well as material, e.g., polyvinyl chloride, polyethylene, steel, etc.); features of the nearby surroundings (foliage such as woods, man-made features such as highways, buildings including building types such as a hospital, other landmarks), date of installation of the subject utility, the type of utility (water, gas, etc.), a source or origin of the utility (an electric power plant, water treatment plant, sewage treatment plant, etc.), nearby population centers, a designated region of interest or boundaries (including size) for the particular installation, the installer entity, the pipe owner/operator entity, as well as the actual locations of the installed conduit. Some of this data will not have associated location information (such as the pipe installer), but much of it will. That location information can be provided in various forms, such as some sort of absolute reference (e.g., global positioning system coordinates, or lat/long), or can be relative map coordinates according to a GIS mapping system; it may also be available from, e.g., engineering drawings for the installation or other nearby structures. If partial information on the pipe location is known (e.g., a single point from an antenna or electronic marker) then that data can also be used. Different frames of reference may be used, i.e., not just a north-south, east-west frame of reference. Rather than Cartesian coordinates the geographic points could alternatively be provided as vectors, e.g., relative to a centroid of the region of interest.

Those skilled in the art will appreciate that this list of input data is not exhaustive. Other data may for example include adjunct facilities (e.g., grinders in a sewage system or repeaters for an fiber optic network), whether the conduit is a main pipe or a service outlet, the ground type, any color-coding associated with the installation, etc.

All of this data becomes ground truth for the cognitive system, i.e., the training data (excluding the pipe locations) are the inputs, and the known pipe locations are the outputs. By training cognitive system 52 using all of these available details associated with a large number of various known pipe installations, cognitive system 52 obtains a basis for making predictions of utility paths for other installations. Then, for a pipe whose location is unknown, the user will enter whatever other data 58 is available for that pipe and the system will output different possible scenarios for the most likely locations of the pipe with corresponding confidence scores. While the location is unknown, there may be other records associated with the installation. At the very least there is a general vicinity for the installation which can be considered a region of interest if no further details are available. This analysis may include characterizing the available data where possible with spatial correlation. There is ample prior art on spatial correlation of geographic information for cognitive systems, see, e.g., chapter 7 of the book "Geographical Information Systems: Principles and Applications" (second edition), by David Mark, entitled "Spatial Representation: A Cognitive View". The prediction by the cognitive system can be followed up with different actions such as placing marker flags on the surface above a predicted pipe path, providing alarm parameters to a backhoe, etc.

Figure 3A:
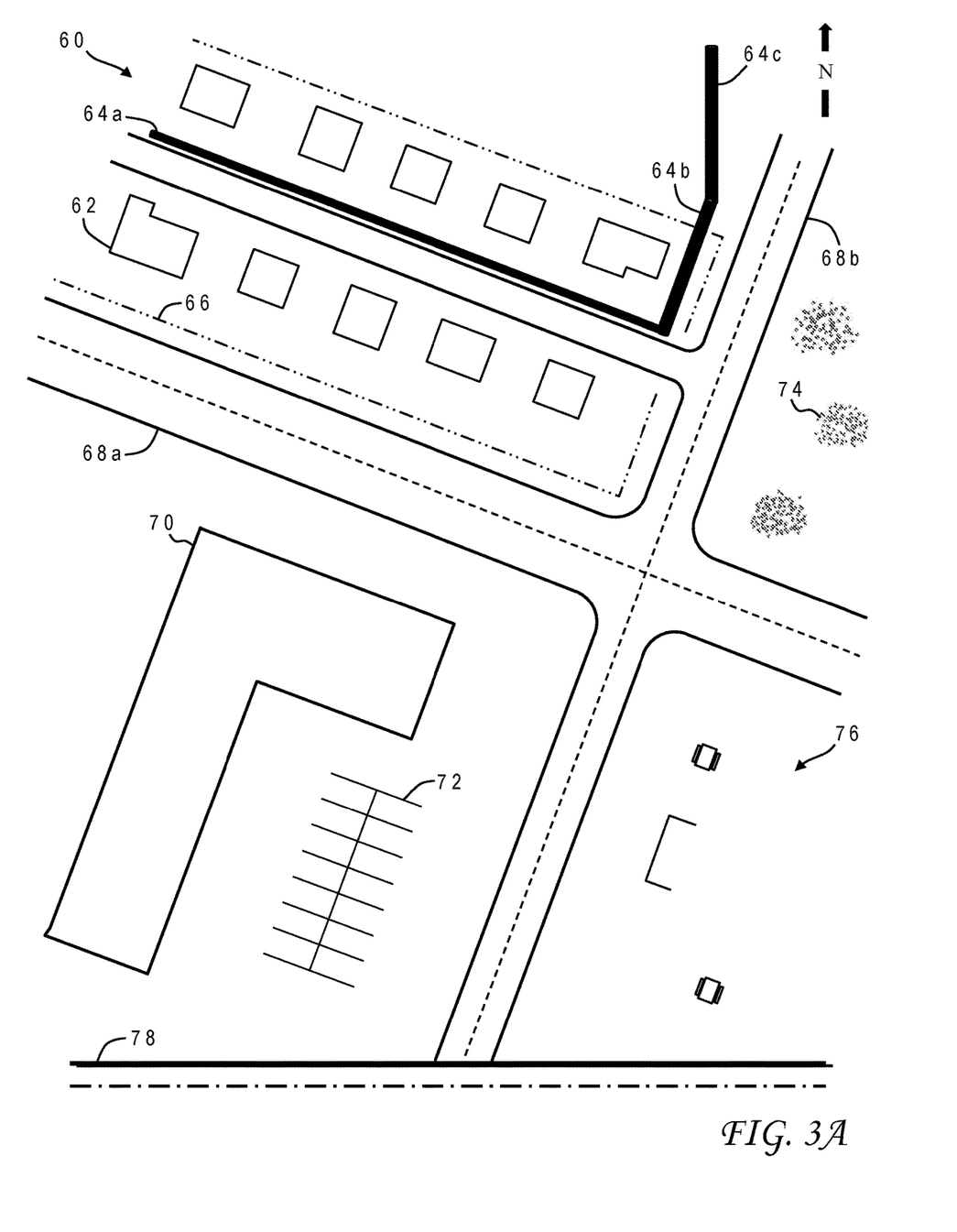
FIGS. 3A and 3B are plan views with two different zoom levels of a portion of a city or town having a residential area with known features and a known path for utility pipe sections to be used as a training input for the cognitive system in accordance with one implementation of the present invention.

One example of how training data might be acquired in accordance with one implementation of the present invention is described with reference to FIGS. 3A and 3B. FIG. 3A shows a plan view of a portion of a city or town having a residential neighborhood 60 composed of a plurality of houses 62 placed along a side street. Water is supplied to neighborhood 60 via several pipe sections 64a, 64b, 64c, the pipe sections having known geographic coordinates. Several features associated with this installation are seen in the close-up view of FIG. 3A. These features include a fence 66 surrounding part of neighborhood 60, two adjacent roads 68a, 68b forming an intersection, a shopping center 70 across from road 68a having a parking lot 72, a wooded area with trees 74 across from road 68b, a park 76 situated catty-cornered from the intersection having recreational facilities such as a soccer goal and picnic tables, and a major highway 78.

Figure 3B:
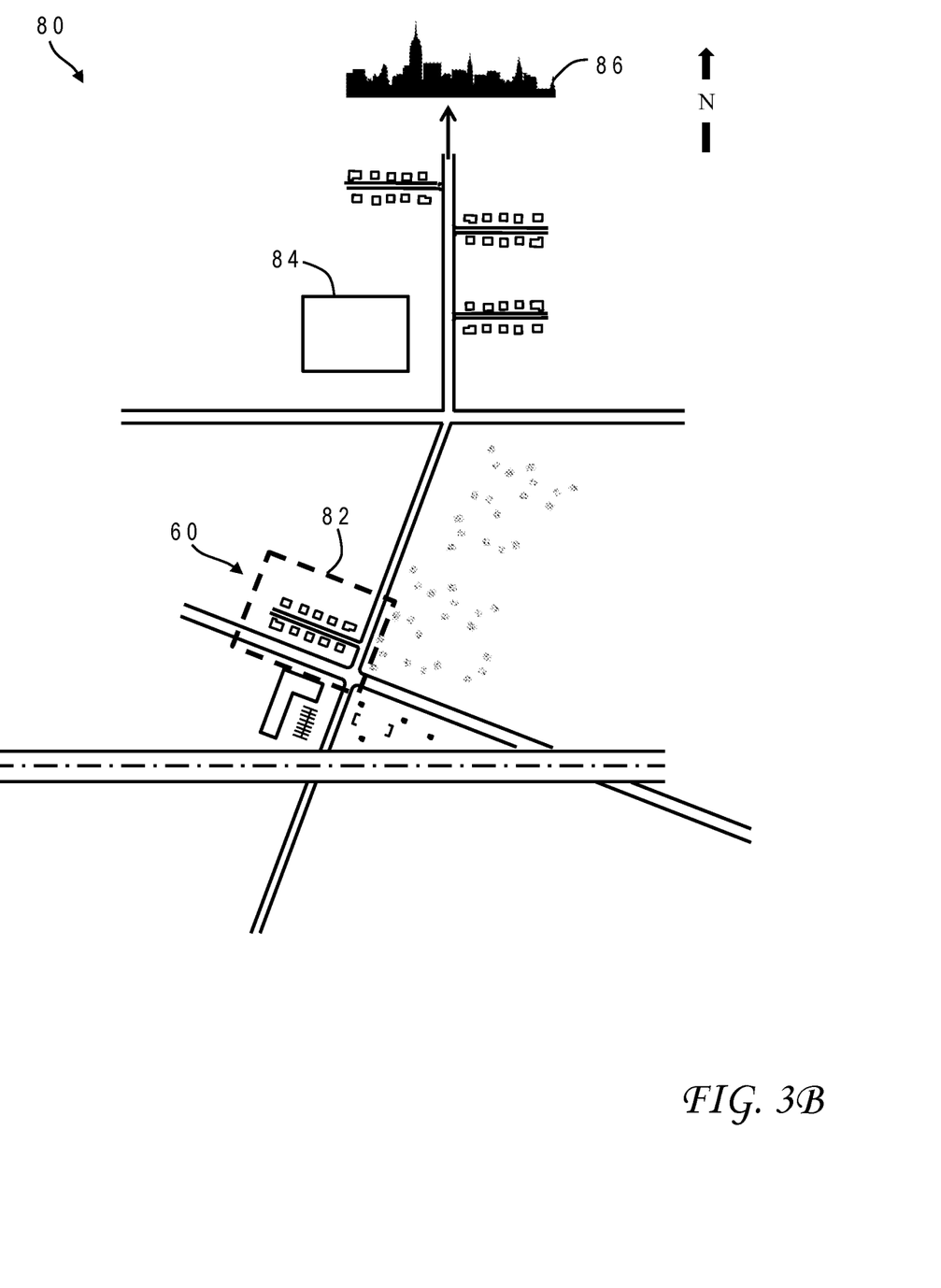

FIG. 3B is another view of the same neighborhood zoomed out to show a wider area 80. In this view a rectangular region 82 can be seen which has been designated either manually or by automated means based on the facility of interest (here, the water pipes); the region need not be rectangular but is preferably polygonal. Additional features seen in this view are other neighborhoods, the water treatment facility 84 which provides the water transported by the subject pipeline, and a population center 86, such as a downtown area of the city. All of these features from FIGS. 3A and 3B may be taken together (including the specific house locations), along with non-geographic data (pipe type, installer, operator, etc.) to form a ground truth for cognitive system 52. The geographic features undergo spatial correlation with respect to some reference point, such as the region of interest or the pipeline itself. For features deemed to have a diffuse boundary or are otherwise a non-point (e.g., a population center, or sections of pipelines), the spatial coordinates may refer to a centroid of the feature.

Figure 4A:
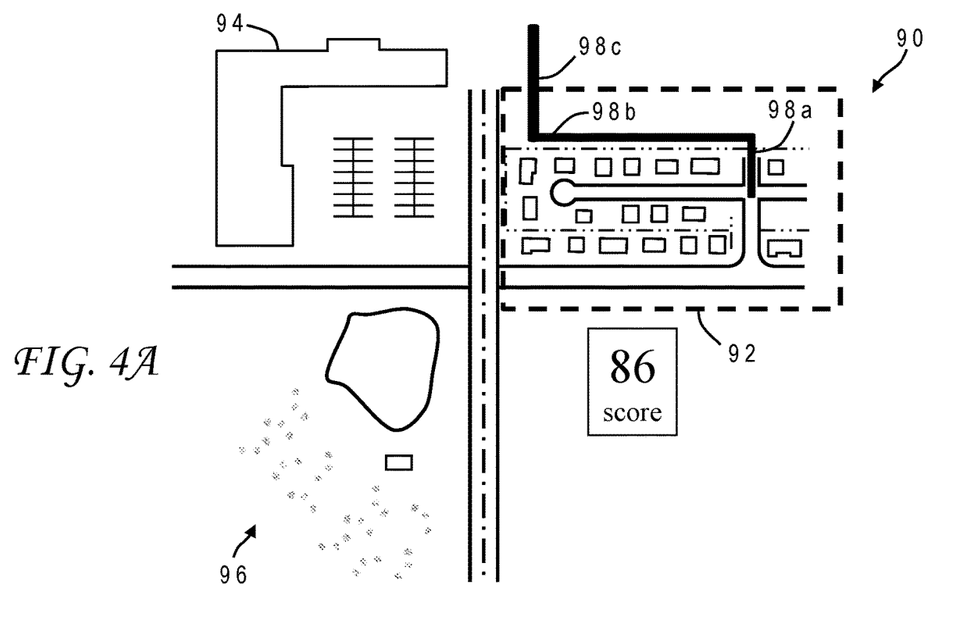
FIGS. 4A and 4B are plan views of a portion of a different city or town having a residential area with a utility pipeline whose location is unknown, showing two different candidate paths with corresponding confidence values in accordance with one implementation of the present invention.
Figure 4B:
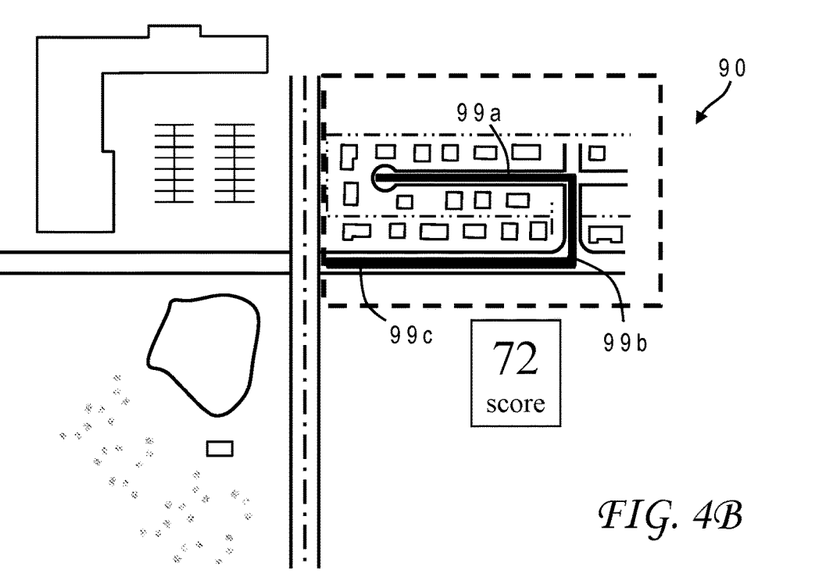

Once so trained, cognitive system 52 is able to predict with varying confidence levels the more likely locations of underground utilities. Application of cognitive system 52 to a facility having an unknown pipe path for one implementation is seen in FIGS. 4A and 4B. According to this example, a contractor is trying to determine the location of a water pipe for another residential area 90 in a different city or town. A rectangular boundary 92 has been designated around the area. The neighborhood again has houses placed at known locations along two streets, with a connecting stub street. There is fencing around the neighborhood, a frontage road to the neighborhood, and a thoroughfare road along a side of the neighborhood. The area opposite the frontage road is empty, while the area opposite the thoroughfare has a shopping center 94. The catty-cornered parcel is a greenbelt 96 having some woods, a pond and an activity shelter. Other pertinent features are not shown as they would be outside the zoom of this view but can still be included in the analysis.

All of the geographic features are spatially correlated with neighborhood 90, e.g., using region-of-interest boundary 92. This geographic information associated with the respective features is used by cognitive system 52 along with the non-geographic features that are available for this facility (pipe type, installer, operator, etc.) as inputs to the cognitive analysis. For this example the system returns two candidate paths for the water pipe. The first path is composed of three pipe sections 98a, 98b, 98c as seen in FIG. 4A. A confidence score of 86 (out of a possible 100 high score=max confidence) has been computed for this first candidate solution. The second path is composed of three pipe sections 99a, 99b, 99c as seen in FIG. 4B. A confidence score of 72 has been computed for this second candidate solution. These proposed solutions may be presented to the user in any convenient fashion; for example, the views seen in FIG. 4A and FIG. 4B may be presented on a display device of the computer system running the cognitive system through an appropriate graphical user interface, along with the confidence scores as seen in the figures. This information can also be translated to GIS data for use with GIS products.

Once the contractor has some rational basis for so predicting the pipe locations, they can focus attention on one or more selected candidates. Further to this example, the contractor would first attempt to confirm the presence of the pipeline as suggested in the view of FIG. 4A since that solution was returned with the highest confidence score. The attempt at confirming the presence of the pipeline may be carried out using any conventional locating method. Once the presence of the pipeline is confirmed, additional action can be taken such as placing above-ground markers or flags along the confirmed path for later guidance with excavation, etc.

Figure 5:
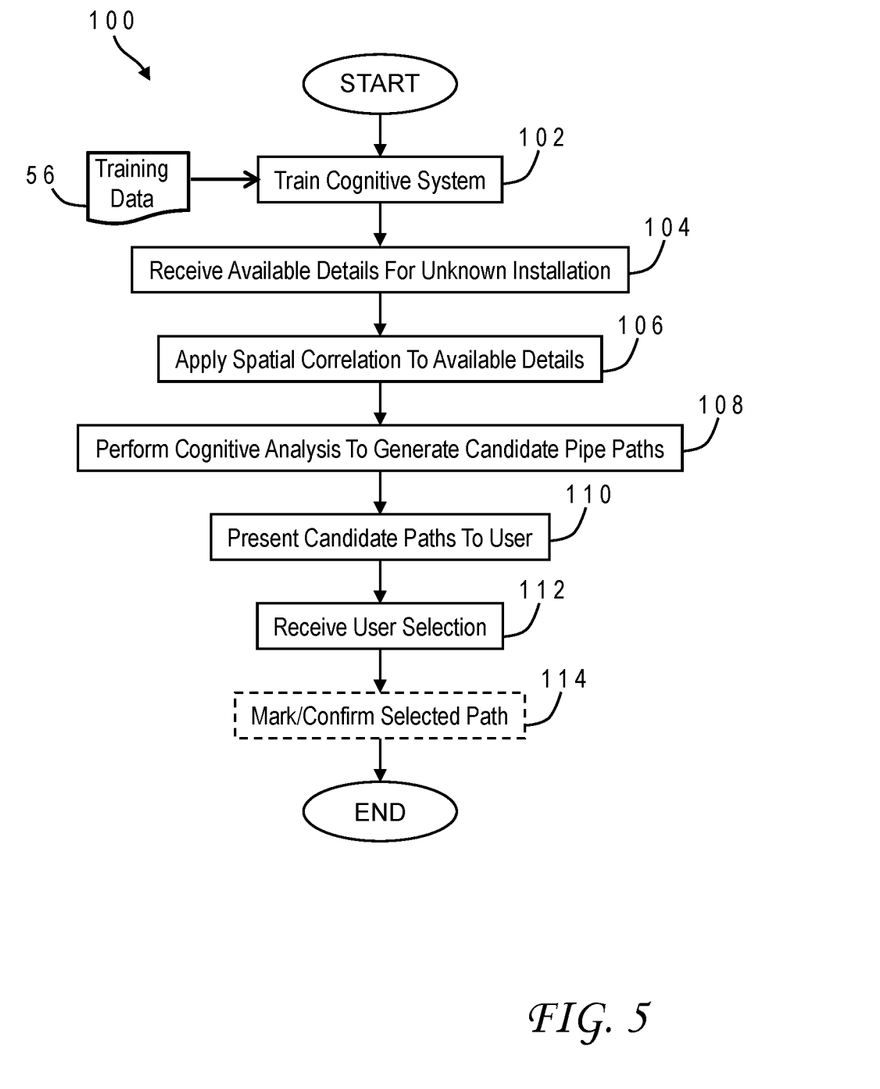
FIG. 5 is a chart illustrating the logical flow for an underground utility path prediction process in accordance with one implementation of the present invention.

The invention may be further understood with reference to the chart of FIG. 5 which illustrates the logical flow for a cognitive pipe path prediction process 100 in accordance with one implementation. Process 100 may be carried out using computer system 10, and begins by training the cognitive system (102). This training may be performed using training data 56 as described in conjunction with FIG. 2. The system then receives whatever data (geographic and non-geographic) is available for the site under consideration (104). Spatial correlation is applied to any available geographic features (106). Cognitive analysis is carried out using these details to generate candidate pipe paths (108). The candidate solutions are presented to the user along with any confidence scores (110). The user may then select one of the candidate solutions for further investigation (112). This step may result in instructions/arrangements being sent electronically to an appropriate service. The foregoing steps complete the involvement of the computer system, but further action may still be taken by the contractor such as confirming and marking the path selected for investigation (114).

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention has been described with reference to the location of a water pipe for a residential neighborhood, but it is applicable to any kind of buried infrastructure, including infrastructure associated with industrial or commercial installations. It is therefore contemplated that such modifications can be made without departing from the spirit or scope of the present invention as defined in the appended claims.

What is claimed is:

1. A method of predicting a path of an underground utility having an unknown location comprising:
receiving installation details associated with the underground utility including geographic features from a user, by executing first instructions in a computer system;
applying spatial correlation to the geographic features to derive geographic locations relative to a region of interest for the underground utility, by executing second instructions in the computer system;
performing cognitive analysis on the geographic features in association with the geographic locations using a cognitive system to generate at least one candidate utility path, by executing third instructions in the computer system; and
presenting the candidate utility path to the user, by executing fourth instructions in the computer system.

2. The method of claim 1 further comprising training the cognitive system with historical details associated with multiple historical utility installations whose underground paths are known.

3. The method of claim 1 wherein the region of interest has a rectangular boundary.

4. The method of claim 1 wherein the installation details further include nongeographic features, and the cognitive analysis uses the nongeographic features.

5. The method of claim 1 wherein the cognitive analysis generates multiple candidate utility paths each of which is presented to the user.

6. The method of claim 5 wherein the cognitive analysis computes a confidence score for each of the multiple candidate utility paths, and the multiple candidate utility paths are presented to the user in conjunction with the respective confidence scores.

7. The method of claim 1 further comprising confirming the underground utility lies along the candidate utility path.

8. A computer system comprising:
   one or more processors which process program instructions;
   a memory device connected to said one or more processors; and
   program instructions residing in said memory device for predicting a path of an underground utility having an unknown location by receiving installation details associated with the underground utility including geographic features from a user, applying spatial correlation to the geographic features to derive geographic locations relative to a region of interest for the underground utility, performing cognitive analysis on the geographic features in association with the geographic locations using a cognitive system to generate at least one candidate utility path, and presenting the candidate utility path to the user.

9. The computer system of claim 8 further comprising program instructions residing in said memory device for training the cognitive system with historical details associated with multiple historical utility installations whose underground paths are known.

10. The computer system of claim 8 wherein the region of interest has a rectangular boundary.

11. The computer system of claim 8 wherein the installation details further include nongeographic features, and the cognitive analysis uses the nongeographic features.

12. The computer system of claim 11 wherein the nongeographic features include a date of installation of the underground utility.

13. The computer system of claim 8 wherein the cognitive analysis generates multiple candidate utility paths each of which is presented to the user.

14. The computer system of claim 13 wherein the cognitive analysis computes a confidence score for each of the multiple candidate utility paths, and the multiple candidate utility paths are presented to the user in conjunction with the respective confidence scores.

15. A method of predicting a path of an underground utility having an unknown location comprising:
   receiving installation details associated with the underground utility, the installation details including multiple geographic features selected from the group consisting of houses, fences, parks, foliage, roads, shopping centers, population centers, city areas, buildings and landmarks;
   defining a region of interest for the underground utility, the region of interest having known boundaries;
   deriving geographic locations for the geographic features relative to the region of interest; and
   performing cognitive analysis on the geographic features in association with the geographic locations using a cognitive system to generate at least one candidate utility path for the underground utility.

16. The method of claim 15 further comprising training the cognitive system with historical details associated with multiple historical utility installations whose underground paths are known, wherein said training includes correlating geographic locations of historical geographic features associated with the historical utility installations relative to historical regions of interest for the historical utility installations, with the historical geographic features.

17. The method of claim 15 wherein:
   the installation details further include multiple nongeographic features selected from the group consisting of an installer of the underground utility, an operator of the underground utility, or a conduit type of the underground utility; and
   the cognitive analysis uses the nongeographic features to perform the cognitive analysis.

18. The method of claim 17 wherein the nongeographic features further include a date of installation of the underground utility which is used in the cognitive analysis.

* * * * *